United States Patent
Osawa et al.

(10) Patent No.: US 12,481,220 B2
(45) Date of Patent: Nov. 25, 2025

(54) LIGHTING OPTICAL SYSTEM AND EXPOSURE APPARATUS

(71) Applicant: USHIO DENKI KABUSHIKI KAISHA, Tokyo (JP)

(72) Inventors: Osamu Osawa, Tokyo (JP); Koichi Ito, Tokyo (JP)

(73) Assignee: USHIO DENKI KABUSHIKI KAISHA (JP)

( * ) Notice: Subject to any disclaimer, the term of this patent is extended or adjusted under 35 U.S.C. 154(b) by 95 days.

(21) Appl. No.: 18/575,358

(22) PCT Filed: Mar. 24, 2022

(86) PCT No.: PCT/JP2022/013874
§ 371 (c)(1),
(2) Date: Dec. 29, 2023

(87) PCT Pub. No.: WO2023/281850
PCT Pub. Date: Jan. 12, 2023

(65) Prior Publication Data
US 2024/0319610 A1    Sep. 26, 2024

(30) Foreign Application Priority Data
Jul. 8, 2021   (JP) .................. 2021-113402

(51) Int. Cl.
G03F 7/00       (2006.01)
G02B 27/09      (2006.01)

(52) U.S. Cl.
CPC ..... *G03F 7/70308* (2013.01); *G02B 27/0955* (2013.01); *G03F 7/7005* (2013.01); *G03F 7/70316* (2013.01); *G03F 7/70583* (2013.01)

(58) Field of Classification Search
CPC ...... G03F 7/7005; G03F 7/70075; G03F 7/20; G03F 7/70008; G03F 7/70133;
(Continued)

(56) References Cited

U.S. PATENT DOCUMENTS 5,815,248 A * 9/1998 Nishi .................. G03F 7/70108
                                                     355/71
5,822,125 A * 10/1998 Meyers ................ G02B 3/0068
                                                     348/E5.028
(Continued)

FOREIGN PATENT DOCUMENTS

JP    2001-147305 A    5/2001
JP    2003-107400 A    4/2003
(Continued)

OTHER PUBLICATIONS

Machine translation of JP 2016188878 A.*
(Continued)

*Primary Examiner* — Deoram Persaud
(74) *Attorney, Agent, or Firm* — Harness, Dickey & Pierce, P.L.C.

(57) ABSTRACT

Disclosed herein is a lighting optical system comprising: a light source having a plurality of light-emitting elements configured to emit light from light-emitting surfaces, respectively; a relay optical system configured to convert a luminous intensity distribution of light emitted from each of the light-emitting elements into an irradiance distribution and to superimpose a plurality of the irradiance distributions corresponding to the plurality of light-emitting elements on each other on a superimposed surface; an optical integrator having a plurality of wavefront splitting elements arranged in parallel to each other, the plurality of wavefront splitting elements being configured to wavefront split irradiated light through the relay optical system and to transmit the wavefront split light as a plurality of pencils of light rays; and a condenser optical system configured to superimpose the plurality of pencils of light rays on each other on a surface to be irradiated.

8 Claims, 16 Drawing Sheets

(58) Field of Classification Search
CPC ............ G03F 7/70308; G03F 7/70316; G03F 7/70583; H01L 25/0753; G02B 27/0911; G02B 27/0922; G02B 7/04; G02B 19/00; G02B 19/0014; G02B 19/0052; G02B 19/0057; G02B 19/0061; G02B 19/0066; G02B 27/0905; G02B 27/0927; G02B 27/0955; G02B 27/0961; G02B 3/0056; G02B 3/0062; G02B 3/0006
See application file for complete search history.

(56) References Cited

U.S. PATENT DOCUMENTS

| | | | | |
|---|---|---|---|---|
| 2001/0033433 | A1* | 10/2001 | Shinoda | G02B 19/0085 359/799 |
| 2002/0154284 | A1* | 10/2002 | Sato | G03F 7/70066 355/71 |
| 2020/0248890 | A1 | 8/2020 | Osaka et al. | |
| 2024/0402610 | A1* | 12/2024 | Osawa | G03F 7/70091 |

FOREIGN PATENT DOCUMENTS

| | | |
|---|---|---|
| JP | 2007-025613 A | 2/2007 |
| JP | 2016-188878 A | 11/2016 |
| JP | 2020-122921 A | 8/2020 |
| WO | 2013-187299 A1 | 12/2013 |

OTHER PUBLICATIONS

Extended European Search Report for corresponding European Patent Application No. 22837272.8 dated Oct. 8, 2024 (10 Pages).
International Search Report of the International Searching Authority, issued in PCT/JP2022/013874, mailed May 31, 2022; ISA/JP (6 pages).
Notice of Reasons for Refusal issued in corresponding Japanese Patent Application No. 2021-113402 dated Nov. 6, 2024, with English translation (9 Pages).

* cited by examiner

LIGHTING OPTICAL SYSTEM AND EXPOSURE APPARATUS

CROSS REFERENCE TO RELATED APPLICATIONS

This application is a 371 U.S. National Phase of International Application No. PCT/JP2022/013874, filed on Mar. 24, 2022, which claims priority to Japanese Patent Application No. 2021-113402, filed Jul. 8, 2021. The entire disclosures of the above applications are incorporated herein by reference.

TECHNICAL FIELD

The present invention relates to a lighting optical system and an exposure apparatus.

BACKGROUND ART

There have been known exposure apparatuses and lighting optical systems that are used in the manufacturing processes of semiconductor devices, flat panel displays, Micro Electro Mechanical Systems (MEMS), and the like.

Conventionally, high-brightness discharge lamps such as super high-pressure mercury vapor lamps and metal halide lamps have been used as light sources for exposure apparatuses. In contrast, with recent technological advances in light-emitting elements such as Light Emitting Diodes (LEDs) and Laser Diodes (LDs), certain technologies have been proposed to employ multiple LEDs as the light source for an exposure apparatus.

LEDs are known to have a low amount of radiant flux per chip when used as a light source for exposure. For this reason, in order to obtain the higher irradiance as desired on a surface to be irradiated, it is required to superimpose light from multiple chips in the lighting optical system to be guided to the surface to be irradiated.

For example, Patent Literature 1 (Laid-open Publication of Japanese Patent Application No. 2016-188878 A) discloses a lighting optical system and an exposure apparatus in which respective images of light-emitting surfaces in multiple LEDs are enlarged to a size that covers the effective area on the incident surface side of the fly-eye lens, respectively, and the enlarged images are projected on the incident surface such that the enlarged images are superimposed on each other on the incident surface side of the fly-eye lens.

However, when the lighting optical system and the exposure apparatus disclosed in Patent Literature 1 are actually assembled (and actually used), the proportion of light reaching the surface to be irradiated relative to the light emitted from the multiple light-emitting elements is found to be low (i.e., the utilization efficiency of light is low). Therefore, when, in particular, the aperture diaphragm is narrowed in order to increase the exposure resolution depending on the pattern size to be exposed, the irradiance on the surface to be irradiated is likely to be insufficient, resulting in a longer exposure time.

The present invention has been made in order to solve the above mentioned problems and an object thereof is to utilize light from multiple light-emitting elements with higher efficiency.

SUMMARY

In order to solve the above mentioned problems, according to one aspect of the present invention, there is provided a lighting optical system comprising: a light source having a plurality of light-emitting elements configured to emit light from light-emitting surfaces, respectively, the plurality of light-emitting elements being aligned with each other in a direction in which the light-emitting surfaces spread; a relay optical system configured to convert a luminous intensity distribution of light emitted from each of the light-emitting elements into an irradiance distribution and to superimpose a plurality of the irradiance distributions corresponding to the plurality of light-emitting elements on each other on a superimposed surface; an optical integrator having a plurality of wavefront splitting elements arranged in parallel to each other, the plurality of wavefront splitting elements being configured to wavefront split irradiated light through the relay optical system and to transmit the wavefront split light as a plurality of pencils of light rays; and a condenser optical system configured to superimpose the plurality of pencils of light rays on each other on a surface to be irradiated.

According to the above lighting optical system, light rays from respective light-emitting elements are superimposed on each other as an irradiance distribution having a circular shape on the superimposed surface. Therefore, it makes it possible to guide light passing through an aperture diaphragm having a circular shape to the condenser optical system with higher efficiency, resulting in higher utilization efficiency of light emitted from the light source.

Furthermore, in the above lighting optical system, it is preferable that the relay optical system may include: a group of condenser lenses having a plurality of first lens elements corresponding to the plurality of light-emitting elements, respectively, each of the first lens elements being configured to condense light from each of the light-emitting elements; a lens array having a plurality of second lens elements corresponding to the plurality of first lens elements, respectively, irradiated light with the irradiance distribution corresponding to the luminous intensity distribution of light emitted from each of the light-emitting elements being irradiated through each of the first lens elements onto an incident surface of each of the second lens elements; and a relay lens configured to optically cooperate with exit surfaces of the second lens elements of the lens array, respectively, and to guide respective irradiated light rays irradiated onto the incident surfaces of the second lens elements to the superimposed surface and to superimpose each other on the superimposed surface.

According to the above configured relay optical system, it makes it possible to share functions of the relay optical system by the group of condenser lenses, the lens array, and the relay lens, resulting in easily realizing the relay optical system.

Furthermore, in the above lighting optical system, it is preferable that a distance from the relay lens to an incident surface of the optical integrator may be shorter than a distance from the relay lens to the superimposed surface.

In this case, even when the incident surface of the optical integrator is positioned at this distance, the utilization efficiency of light hardly changes and the irradiance distribution becomes flat to the periphery on a plane of the aperture diaphragm. Therefore, such arrangement is assumed to be suitable for exposure of finer patterns.

Yet furthermore, in the above lighting optical system, it is also preferable that each of the plurality of second lens elements may have a square outer shape as viewed in a direction along an optical axis, and the plurality of second lens elements may be bundled together.

In this case, by using the square shaped second lens elements, it makes it possible to improve the utilization efficiency of light as compared to the case where circular shaped second lens elements are used.

Yet furthermore, in the above lighting optical system, it is also preferable that each of exit sides of the plurality of first lens elements of the group of condenser lenses may have a square outer shape as viewed in a direction along an optical axis, and the plurality of first lens elements may be bundled together.

In this case, by using the first lens elements having the exit sides in a square shape, it makes it possible to improve the utilization efficiency of light as compared to the case where circular shaped first lens elements are used.

Yet furthermore, in the above lighting optical system, when using the first lens elements having the exit sides in a square shape, it is further preferable that each of the plurality of first lens elements of the group of condenser lenses may have a front element positioned on a side of the light-emitting elements and a rear element positioned on a side of the lens array, and the front element may have a circular outer shape as viewed in the direction along the optical axis and the rear element may have a square outer shape as viewed in the direction along the optical axis.

In this case, by combining the front element having a circular outer shape and the rear element having a square outer shape, it makes it possible to further improve the utilization efficiency of light.

In order to solve the above mentioned problems, according to another aspect of the present invention, there is provided an exposure apparatus comprising the lighting optical system, wherein the exposure apparatus is configured to irradiate a pattern mounted on the surface to be irradiated with light from the lighting optical system and to expose the pattern on an object to be exposed.

According to the above exposure apparatus, it makes it possible to reduce the exposure time for exposing patterns with more efficient light irradiation.

The above exposure apparatus may further comprise a projection optical system configured to project an image of the pattern irradiated with the light from the lighting optical system onto the object to be exposed.

Advantageous Effect of the Invention

According to the present invention, it makes it possible to utilize light from multiple light-emitting elements with higher efficiency.

DETAILED DESCRIPTION

Figure 1:
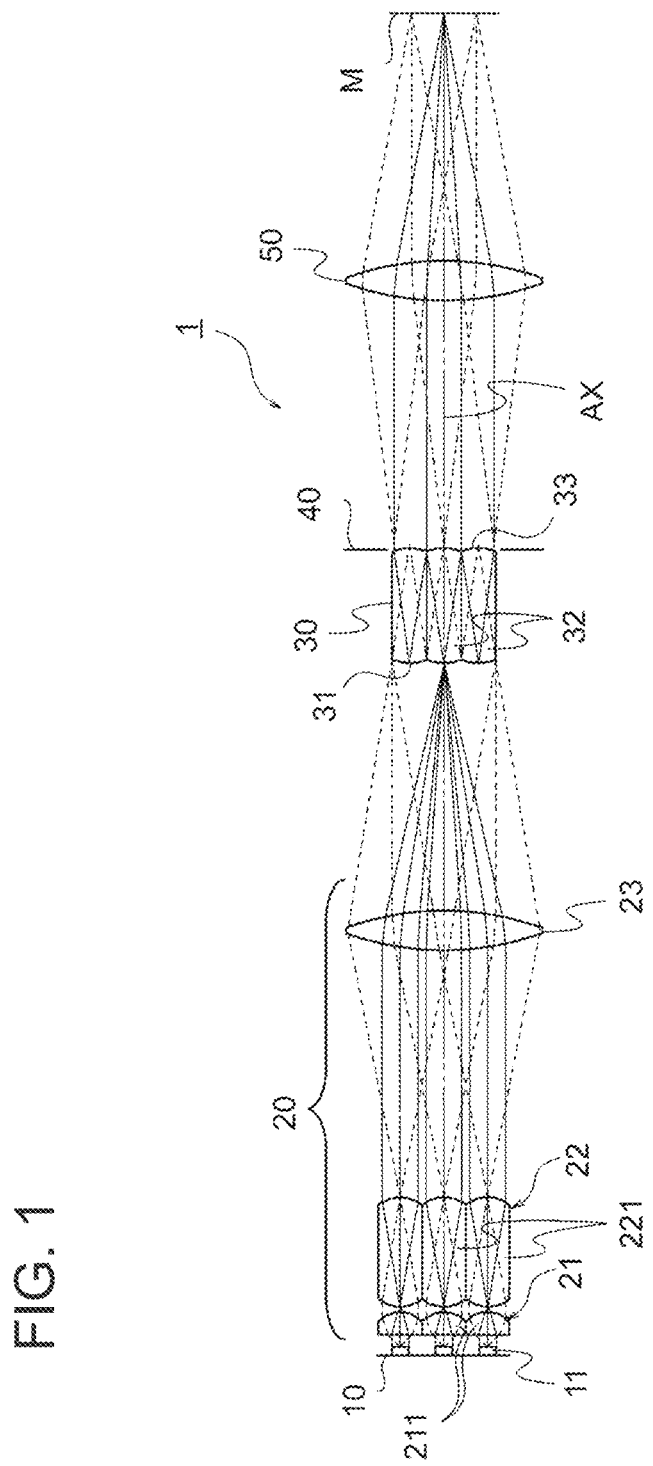
FIG. 1 is a schematic diagram illustrating an exemplary configuration of a lighting optical system according to an embodiment of the present invention.

Hereinafter, non-limiting embodiments of the present invention will be described in detail with reference to the accompanying drawings. It should be noted that, in order to avoid unnecessary redundancy in the following description and to facilitate the understanding of those skilled in the art, in some cases more detailed explanations than necessary may be omitted. For example, in some cases detailed explanations of already well-known matters or duplicate explanations for substantially identical configurations may be omitted. In addition, in some cases elements depicted in the drawings previously described may be referred to as appropriate in the descriptions of subsequent drawings.

FIG. 1 is a schematic diagram illustrating an exemplary configuration of a lighting optical system according to an embodiment of the present invention.

The lighting optical system 1 shown in FIG. 1 is an optical system that irradiates a mask M with light. The mask M has a pattern formed thereon that transmits the irradiated light, and the mask M is mounted on a surface to be irradiated.

The lighting optical system 1 is equipped with a light source 10, a relay optical system 20, an optical integrator 30, an aperture diaphragm 40, and a condenser lens 50. The optical axis AX of the lighting optical system 1 is oriented vertically in FIG. 1. In the following description, the direction of the optical axis AX is used as a referential direction, and the direction along the optical axis AX may be referred to as the Z direction and the two-dimensional direction perpendicular to the optical axis AX may be referred to as the X and Y directions.

The light source 10 is equipped with multiple light-emitting elements 11, and LEDs are used as the light-emitting elements 11, for example. The light-emitting elements 11 are elements that emit light from light-emitting surfaces, respectively, and are not limited to LEDs. For example, alternatively, another light-emitting element 11 may be used in which light from a semiconductor laser is guided by an optical fiber or the like and emitted from a light-emitting surface.

The relay optical system 20 superimposes light rays emitted from respective light-emitting elements 11 of the light source 10 on each other and guides the superimposed light to an incident surface 31 of the optical integrator 30. The structure and action of the relay optical system 20 will be described below in detail.

The optical integrator 30 wavefront splits the wavefront of the light incident on the incident surface 31 with multiple wavefront splitting elements 32, and transmits the wavefront-split light to a side of an exit surface 33. It should be noted that the number of the wavefront splitting elements 32 in the optical integrator 30 does not depend on the number of the light-emitting elements 11 of the light source 10.

The aperture diaphragm 40 narrows down the light emitted from the exit surface 33 of the optical integrator 30. Although the aperture diaphragm 40 may be openable and closable, according to the present embodiment, the aperture diaphragm 40 has a fixed aperture diameter that matches the fineness of the pattern formed on the mask M (i.e., coarse or fine patterns). The size of the aperture diaphragm 40 corresponds to the NA (i.e., numerical aperture) of the lighting optical system, and the size of the aperture diaphragm 40 and the irradiance distribution on the aperture diaphragm plane may affect the resolution performance for each pattern size in the exposure in relation to the NA of the projection optical system.

The condenser lens 50 corresponds to an example of a condenser optical system according to the present invention, and irradiates the light passing through the aperture diaphragm 40 onto the surface to be irradiated (i.e., onto the mask M). The condenser lens 50 may be a combination lens in which multiple lenses are combined with each other.

Figure 2:
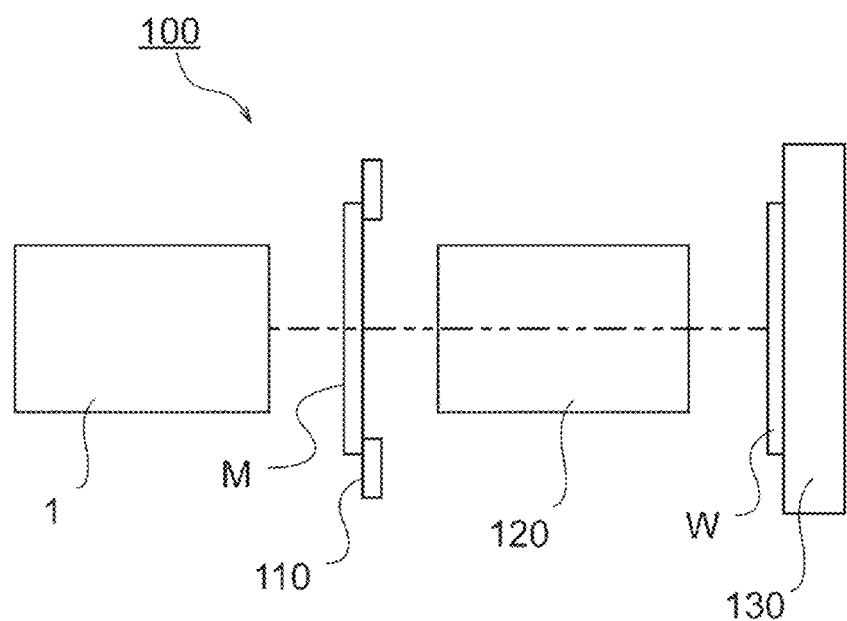
FIG. 2 is a schematic diagram illustrating an exemplary configuration of an exposure apparatus according to an embodiment of the present invention.

FIG. 2 is a schematic diagram illustrating an exemplary configuration of an exposure apparatus according to an embodiment of the present invention.

The exposure apparatus 100 is equipped with the lighting optical system 1, a mask stage 110, a projection optical system 120, and a workpiece stage 130.

The mask stage 110 holds a mask M, and the mask M is irradiated with light by the lighting optical system 1.

The workpiece stage 130 holds a workpiece W to be exposed, such as a glass substrate or a semiconductor substrate, for example.

The projection optical system 120 projects the light transmitted through the mask M onto the workpiece W to expose the workpiece W in a pattern.

Alternatively, the exposure apparatus 100 may be an apparatus in which the workpiece W is held in close proximity or contact with the mask M without the projection optical system 120 intervening.

Referring back to FIG. 1, the details of the relay optical system 20 will be described below.

As a non-limiting example, the relay optical system 20 is equipped with a group of condenser lenses 21, a lens array 22, and a relay lens 23.

The group of condenser lenses 21 is equipped with multiple condenser lenses 211 corresponding to the multiple light-emitting elements 11 of the light source 10, respectively. Likewise, the lens array 22 is equipped with multiple lens elements 221 corresponding to the multiple condenser lenses 211, respectively. The condenser lens 211 of the group of condenser lenses 21 corresponds to an example of a first lens element according to the present invention, and likewise, the lens element 221 of the lens array 22 corresponds to an example of a second lens element according to the present invention.

Each of condenser lenses 211 condenses light emitted from each corresponding light-emitting element 11 to the incident side of the corresponding lens element 221. More specifically, components of the parallel pencils of light rays of the light emitted from the light-emitting elements 11 are condensed by the condenser lenses 211 to points corresponding to the direction of the parallel pencils of light rays, respectively. On the other hand, components of the divergent pencils of light rays of light emitted from respective points on the light-emitting elements 11 are incident on the lens elements 221 as parallel pencils of light rays or as pencils of light rays at an angle close to the parallel pencils of light rays by the condenser lenses 211.

Each of the lens elements 221 of the lens array 22 transmits light from the incident side to the exit side. According to the present embodiment, light condensed at one point on the incident side of the lens element 221 is emitted from the exit side of the lens element 221 as parallel pencils of light rays or as pencils of light rays at an angle close to the parallel pencils of light rays. On the other hand, light incident on the incident side of the lens element 221 as parallel pencils of light rays or as pencils of light rays at an angle close to the parallel pencils of light rays is emitted from one point on the exit side of the lens element 221 as the divergent pencils of light rays.

Figure 3:
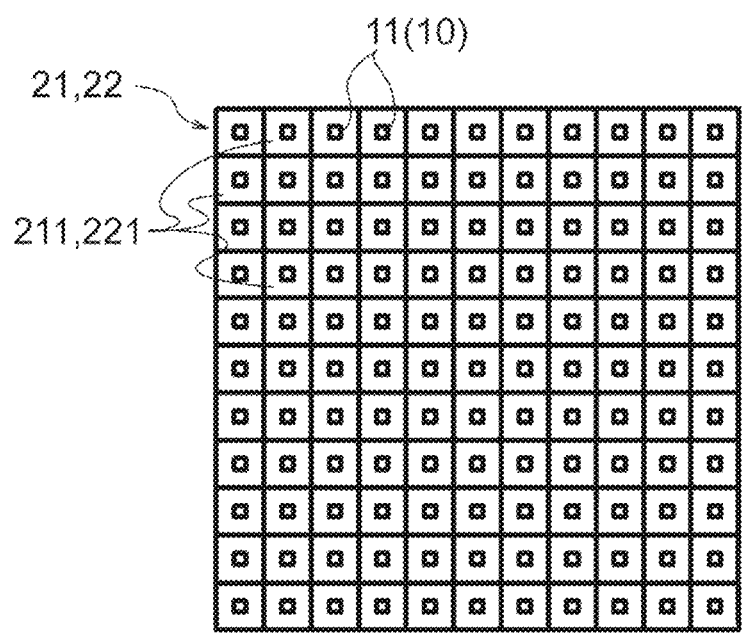
FIG. 3 is a schematic diagram illustrating the positional relationship between the light-emitting elements, the condenser lenses, and the lens elements.

FIG. 3 is a schematic diagram illustrating the positional relationship between the light-emitting elements, the condenser lenses, and the lens elements.

FIG. 3 illustrates the positional relationship between the light-emitting elements 11, the condenser lenses 211, and the lens elements 221 when the light source 10, the group of condenser lenses 21, and the lens array 22 are viewed in the Z direction. It should be noted that the positional relationship shown in FIG. 3 denotes the case in which the irradiation shape on the mask M (i.e., mask surface) is square.

Multiple light-emitting elements 11 are arranged in the X and Y directions, and each of the light-emitting elements 11 has a light-emitting surface in a square shape.

The condenser lenses 211 and the lens elements 221 are deployed corresponding to the light-emitting elements 11, respectively. The outer shape of each of the condenser lenses 211 is square, and the group of condenser lenses 21 is constituted with the square condenser lenses 211 bundled together in the X and Y directions. Similarly, the outer shape of each of the lens elements 221 is square, and the lens array 22 is constituted with the square lens elements 221 bundled together in the X and Y directions. According to the present embodiment, the outer shapes of the group of condenser lenses 21 and the lens array 22 have also square shapes, respectively.

As described above, the condenser lens 211 corresponds to an example of the first lens element according to the present invention. Although the first lens element according to the present invention may have a circular shape, by employing the group of condenser lenses 21, in which the condenser lenses 211 each having the square outer shape are bundled together, it makes it possible to condense the light emitted from respective light-emitting elements 11 of the light source 10 at the group of condenser lenses 21 more efficiently, resulting in higher utilization efficiency of light from multiple light-emitting elements 11.

Likewise, the lens element 221 corresponds to an example of the second lens element according to the present invention. Although the second lens element according to the present invention may have a circular shape, by employing the lens array 22, in which the lens elements each having the square outer shape are bundled together, it makes it possible to allow the light emitted from respective light-emitting elements 11 of the light source 10 to enter the lens array 22 to be transmitted therethrough more efficiently, resulting in higher utilization efficiency of light from multiple light-emitting elements 11.

Each of the condenser lenses 211 of the group of condenser lenses 21 may be a so-called single lens as shown in FIG. 1, or alternatively, each of the condenser lenses 211 may be a combination lens with two lenses, for example.

Figure 4A:
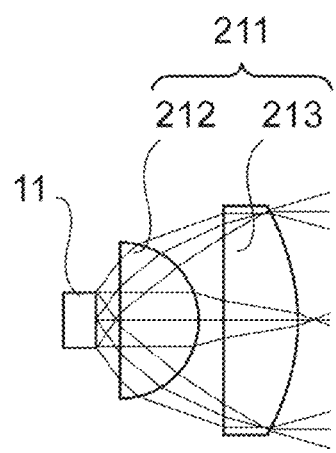
FIGS. 4A and 4B are schematic diagrams illustrating an exemplary configuration of a condenser lens in a structure of a combination lens.
Figure 4B:
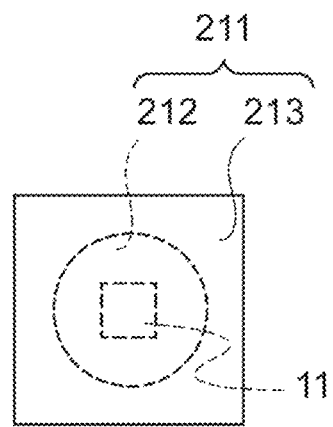

FIGS. 4A and 4B are schematic diagrams illustrating an exemplary configuration of the condenser lens 211 in a structure of the combination lens.

FIG. 4A illustrates a side view and FIG. 4B illustrates a front view of the condenser lens 211 in a structure of the combination lens.

Each of the condenser lenses 211 in the combination lens is constituted with a combination of a front lens 212 on the light-emitting element 11 side and a rear lens 213 on the lens array 22 side. As shown in the front view of FIG. 4B, the front lens 212 has a circular outer shape and the rear lens 213 has a square outer shape. When each of the condenser lenses 211 is constituted with the combination lens, by combining the front lens 212 with a circular shape and the rear lens 213 with a square shape, it makes it possible to improve the utilization efficiency of light. The front lens 212 corresponds to an example of a front element according to the present invention, and the rear lens 213 corresponds to an example of a rear element according to the present invention.

When the group of condenser lenses 21 constituted with the condenser lenses 211 shown in FIGS. 4A and 4B is combined with the lens array 22 shown in FIG. 3, it would be expected that the utilization efficiency of light is improved by about 10% as compared to the case in which the group of condenser lenses 21 constituted with the condenser lens 211 shown in FIGS. 4A and 4B is not combined with the lens array 22 shown in FIG. 3 (i.e., the comparative example, which will be described later).

Referring back to FIG. 1, the detailed description of the lighting optical system according to the present embodiment will continue.

The relay lens 23 superimposes the light rays emitted from respective lens elements 221 of the lens array 22 onto each other to allow the superimposed light to enter the incident surface 31 of the optical integrator 30. More specifically, components of the divergent pencils of light rays of light emitted from respective points on the exit side of the lens array 22 are incident on the incident surface 31 of the optical integrator 30 as parallel pencils of light rays or as pencils of light rays at an angle close to the parallel pencils of light rays. On the other hand, components of the parallel pencils of light rays of the light emitted from the lens array 22, or components of pencils of light rays at the angle close to the parallel pencils of light rays, are condensed to the center on the incident surface 31 of the optical integrator 30.

According to the present embodiment, the incident surface of the lens array 22 and the incident surface 31 of the optical integrator 30 are optically conjugate, and images with irradiance distributions that correspond to the luminous intensity distributions of light-emitting elements 11, respectively, are superimposed onto each other on the incident surface 31.

Figure 5:
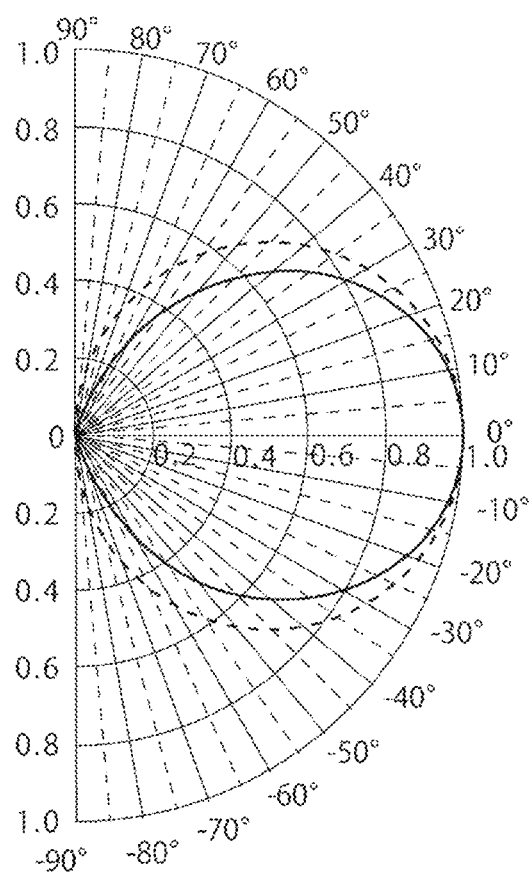
FIG. 5 is a diagram illustrating a luminous intensity distribution property of a light-emitting element.

FIG. 5 is a diagram illustrating a luminous intensity distribution property of the light-emitting element 11.

FIG. 5 illustrates the polar coordinates with the Z direction as 0°, and the luminous intensity distribution property of the light-emitting element 11 is denoted by a solid line. On the other hand, the luminous intensity distribution property denoted by a dotted line in FIG. 5 is the luminous intensity distribution property in case that the light source has a Lambertian luminous intensity distribution. Both the solid line and the dotted line are illustrated as relative values with the 0° direction as 1. As compared to the Lambertian luminous intensity distribution denoted by the dotted line, it would be observed that, in the light-emitting element 11, the light flux is weaker at large angles and stronger at small angles. The incident surface of each of the lens elements 221 of the lens array 22 is irradiated with light in the range of −50° to +50°, for example, which is captured by each of the lens elements 211, out of the light corresponding to the luminous intensity distribution property. When the lens element 221 has a square outer shape, the light irradiated onto the incident surface of the lens element 221 is wider than the inscribed circle of the square. In this case, however, the light rays superimposed on the incident surface 31 of the optical integrator 30 will have a shape similar to a circle, which will result in a higher utilization efficiency of the light on the mask M on the surface to be irradiated.

Here, the irradiance distribution according to the present embodiment shown in FIG. 1 will be described in comparison with a comparative example.

As the comparative example, a certain lighting optical system is used in which the lens array 22 shown in FIG. 1 is not arranged and images of the light-emitting surfaces of the light-emitting elements 11 are superimposed onto each other on the incident surface 31 of the optical integrator 30.

Figure 6:
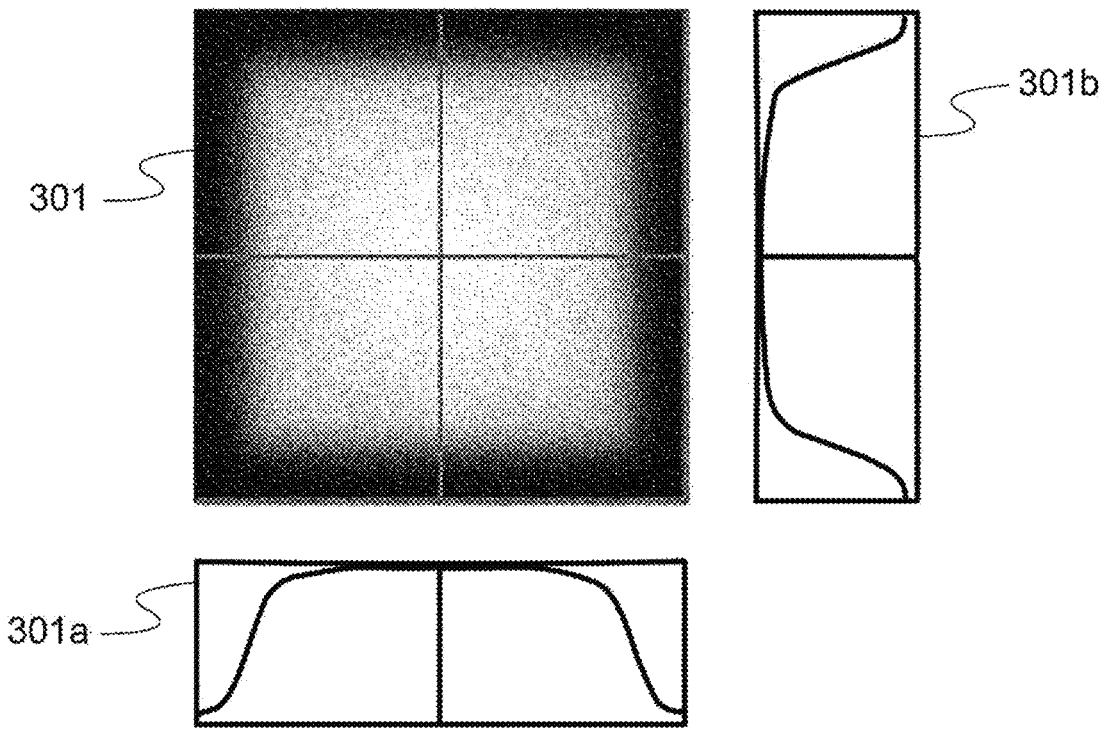
FIG. 6 is a schematic diagram illustrating an irradiance distribution at an incident surface of an optical integrator in a lighting optical system according to a comparative example.

FIG. 6 is a schematic diagram illustrating an irradiance distribution at an incident surface 31 of an optical integrator 30 in the lighting optical system according to a comparative example. On the other hand, FIG. 7 is a schematic diagram illustrating an irradiance distribution at a position of an aperture diaphragm 40 in the lighting optical system according to the comparative example.

Figure 7:
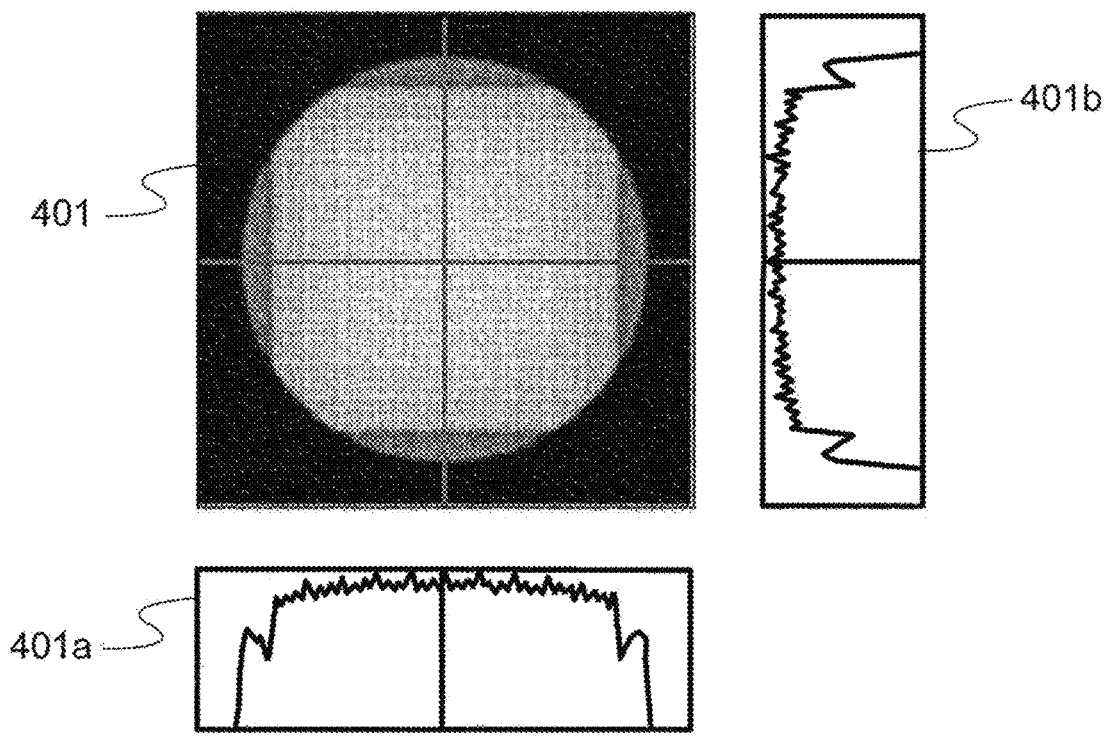
FIG. 7 is a schematic diagram illustrating an irradiance distribution at a position of an aperture diaphragm in the lighting optical system according to the comparative example.

FIGS. 6 and 7 illustrate irradiance distribution charts 301 and 401, which denote two-dimensional irradiance distributions in the X and Y directions, and irradiance graphs 301a and 401a, which denote irradiance distributions on a straight line in the X direction (i.e., transverse direction in the figure) passing through the center of the irradiance distribution charts 301 and 401, respectively, and irradiance graphs 301b and 401b, which denote irradiance distributions on a straight line in the Y direction (i.e., vertical direction in the figure) passing through the center of the irradiance distribution charts 301 and 401, respectively. Hereinafter, the same applies to other irradiance distribution charts.

As shown in the irradiance distribution chart 301 in FIG. 6, light is irradiated in a square shape on the incident surface 31 of the optical integrator 30 according to the comparative example. Also, as shown in the irradiance graphs 301a and 301b, it would be observed that the irradiance distribution is close to be uniform within the region irradiated with the light on the incident surface 31.

It should be noted that the irradiance distribution in the comparative example is the irradiance distribution when designed to confer the best utilization efficiency of light on the surface to be irradiated.

The total quantity of light across the incident surface 31 of the optical integrator 30 is 756.2 in a relative value, which is relative to the quantity of light emitted from the light source 10.

As a result of light with a nearly uniform irradiance distribution being irradiated onto the incident surface 31 of the optical integrator 30 in a square shape, the light is blocked at the four corners of the irradiance distribution by the aperture diaphragm 40 having a circular shape, as shown in the irradiance distribution diagram 401 in FIG. 7. Resultantly, in the comparative example, the total quantity of light passing through the aperture diaphragm 40 is 507.0 in the above relative value. Furthermore, as shown in the irradiance graphs 401a and 401b in FIG. 7, the irradiance of light passing through the aperture diaphragm 40 drops considerably in the peripheral areas in the vertical and horizontal directions. Therefore, for fine patterns, it is preferable to design the lighting optical system 1 to have a wider irradiance area so as not to reduce the irradiance in those peripheral areas. In this case, the light blocked by the aperture diaphragm 40 increases, and the total quantity of light becomes 454.1 in the above relative value, resulting in further lowering the utilization efficiency of light.

Figure 8:
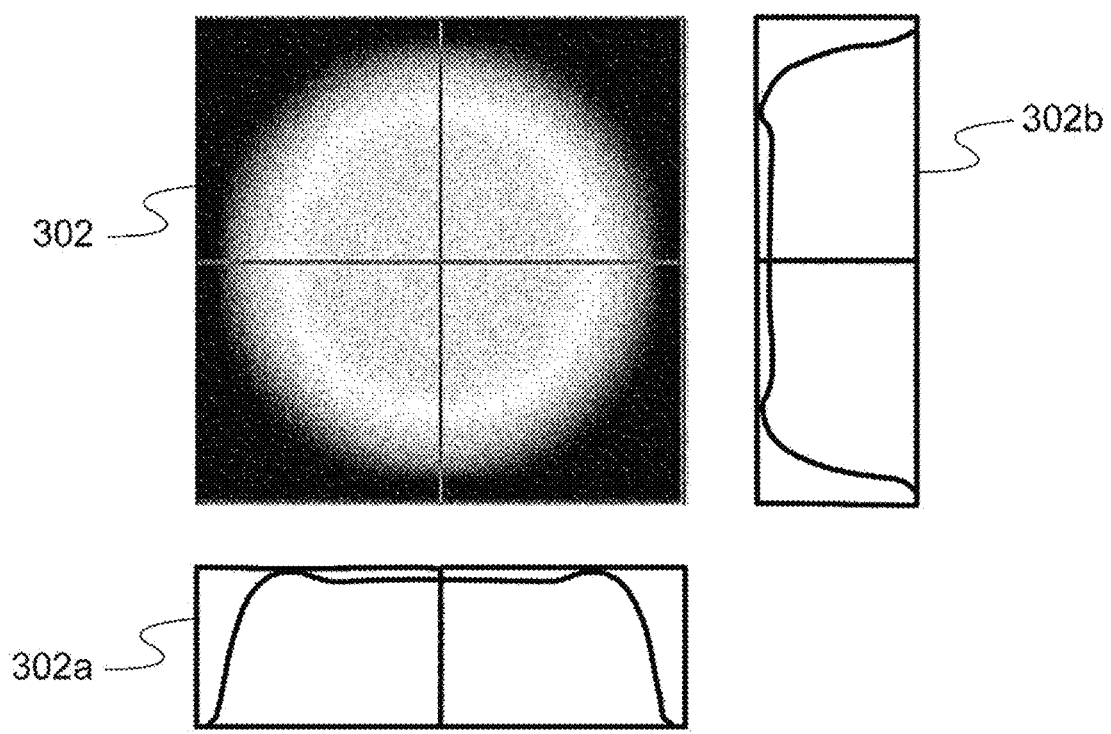
FIG. 8 is a schematic diagram illustrating an exemplary irradiance distribution at an incident surface of an optical integrator in a lighting optical system shown in FIG. 1.
Figure 9:
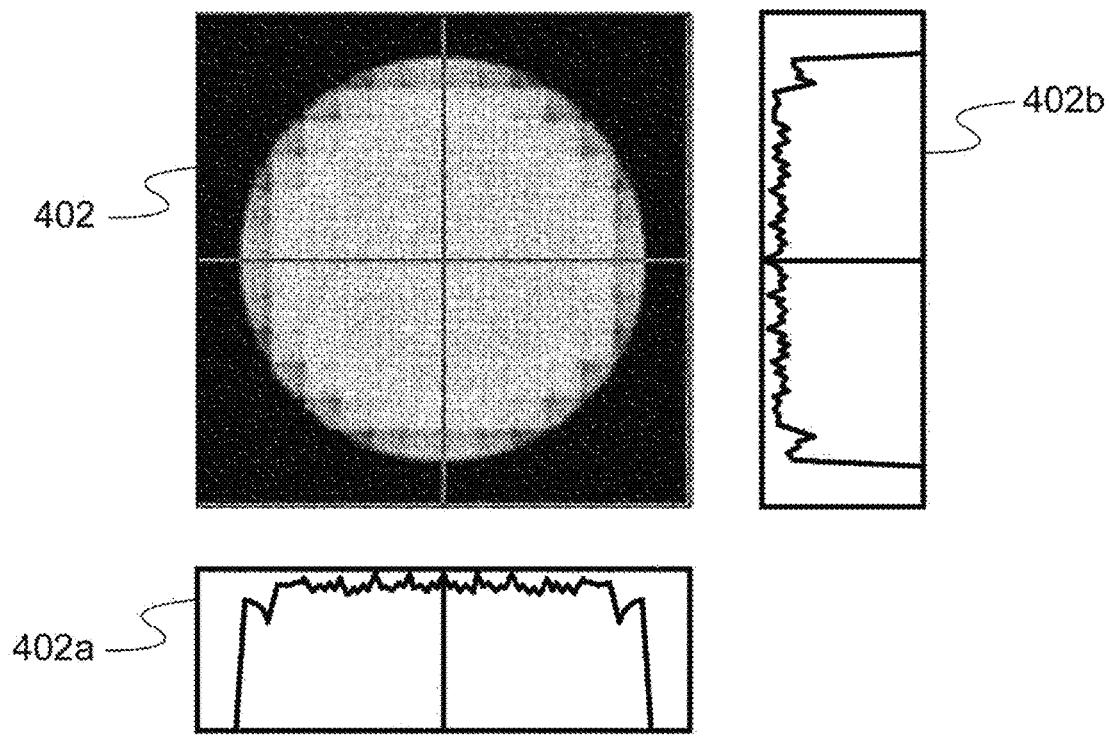
FIG. 9 is a schematic diagram illustrating an exemplary irradiance distribution at a position of an aperture diaphragm in the lighting optical system shown in FIG. 1.

FIG. 8 is a schematic diagram illustrating an exemplary irradiance distribution at the incident surface 31 of the optical integrator 30 in the lighting optical system 1 shown in FIG. 1. FIG. 9 is a schematic diagram illustrating an exemplary irradiance distribution at a position of the aperture diaphragm 40 in the lighting optical system 1 shown in FIG. 1.

As shown in the irradiance distribution graph 302 in FIG. 8, in the lighting optical system 1 according to the present embodiment shown in FIG. 1, the light is irradiated in a round shape on the incident surface 31 of the optical integrator 30. Furthermore, as shown in the irradiance graphs 302a and 302b, the irradiance distribution is close to be uniform within the region irradiated with the light on the incident surface 31, and the irradiance is slightly higher at the outer edges of the irradiated region. In the lighting optical system 1 according to the present embodiment, the total quantity of light across the entire incident surface 31 of the optical integrator 30 is 729.2 in the above relative value.

As a result of light with a nearly uniform irradiance distribution being irradiated onto the incident surface 31 of the optical integrator 30 in a circular shape, the light passes through the entire aperture of the aperture diaphragm 40, as shown in the irradiance distribution chart 402 in FIG. 9. Also, as shown in the irradiance graphs 402a and 402b in FIG. 9, the light passing through the aperture diaphragm 40 has an irradiance distribution that is nearly uniform over the aperture. Resultantly, in the lighting optical system 1 according to the first embodiment, the total quantity of light passing through the aperture diaphragm 40 is 558.1 in the above relative value, resulting in the higher utilization efficiency of light as compared to the comparative examples shown in FIGS. 6 and 7.

Next, modifications to the lighting optical system 1 according to the present embodiment will be described below.

Figure 10:
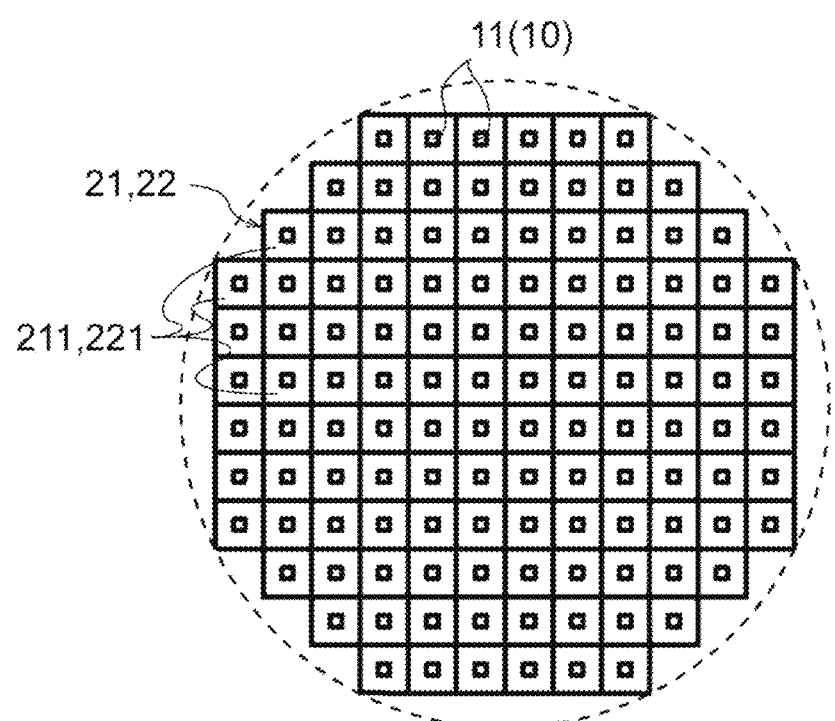
FIG. 10 is a schematic diagram illustrating a first modification to the arrangement of the light-emitting elements, the condenser lenses, and the lens elements.
Figure 11:
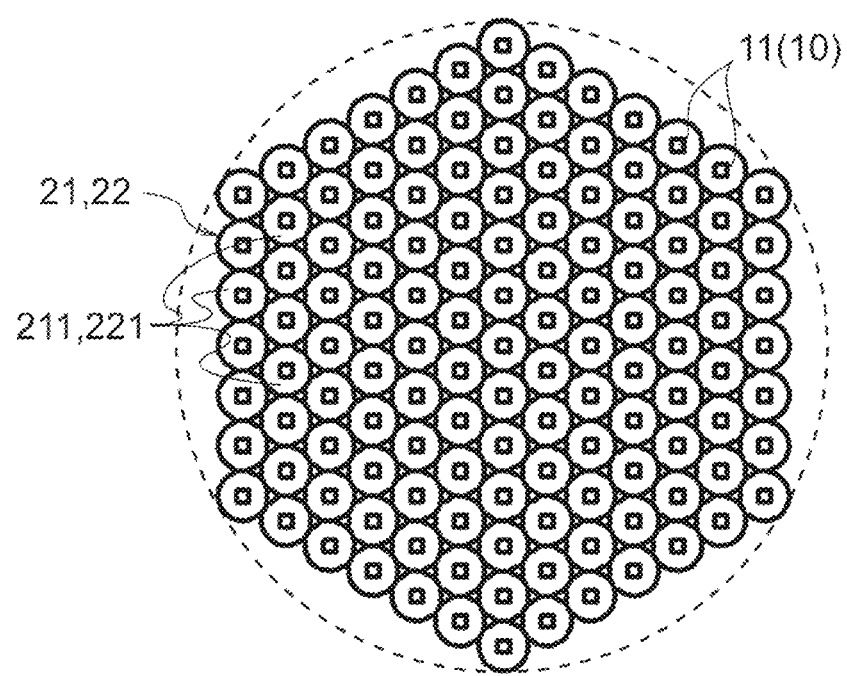
FIG. 11 is a schematic diagram illustrating a second modification to the arrangement of the light-emitting elements, the condenser lenses, and the lens elements.

FIGS. 10 and 11 are schematic diagrams illustrating modifications to the arrangement of the light-emitting elements 11, the condenser lenses 211, and the lens elements 221, respectively, in the case in which the irradiation shape at the mask M (i.e., mask surface) is circular.

In the modification shown in FIG. 10, the light-emitting elements 11 of the light source 10 are arranged to be aligned vertically and horizontally within the circular area denoted by the dotted line. According to the modification also shown in FIG. 10, the condenser lenses 211 and the lens elements 221 each have a square outer shape, and the condenser lenses 211 and the lens elements 221 are arranged corresponding to the light-emitting elements 11, respectively.

Even with the circular arrangement shown in FIG. 10, by configuring each of the condenser lenses 211 and the lens elements 221 to have the square outer shape, it makes it possible to improve the utilization efficiency of light.

In the modification shown in FIG. 11, the light-emitting elements 11 of the light source 10 are arranged in a hexagonal shape that fits within the circular area denoted by the dotted line. The arrangement of the light-emitting elements 11 is an array of intersecting rows in three directions that differ 60° from each other. According to the modification shown in FIG. 11, the condenser lenses 211 and the lens elements 221 each have a circular outer shape, and the condenser lenses 211 and the lens elements 221 are arranged corresponding to the light-emitting elements 11, respectively. It should be noted that, alternatively, the condenser lenses 211 and the lens elements 221 may each have a hexagonal outer shape.

In the modification in which the condenser lenses 211 and the lens elements 221 each have a circular outer shape, the utilization efficiency of light is likely to be lower as compared to the arrangement shown in FIGS. 3 and 10. However, this modification shown in FIG. 11 allows more light-emitting elements 11 to be arranged within the circular area denoted by the dotted line. In addition, the modification shown in FIG. 11 has the flat irradiance distribution on a plane of the aperture diaphragm 40. For this reason, compared to the comparative examples in FIGS. 6 and 7, where the irradiation region is designed to be wide on the incident surface 31 of the optical integrator 30 so as to obtain the flat irradiance distribution across the plane of the aperture diaphragm 40 to the periphery, it makes it possible to attain the higher utilization efficiency of light.

Figure 12:
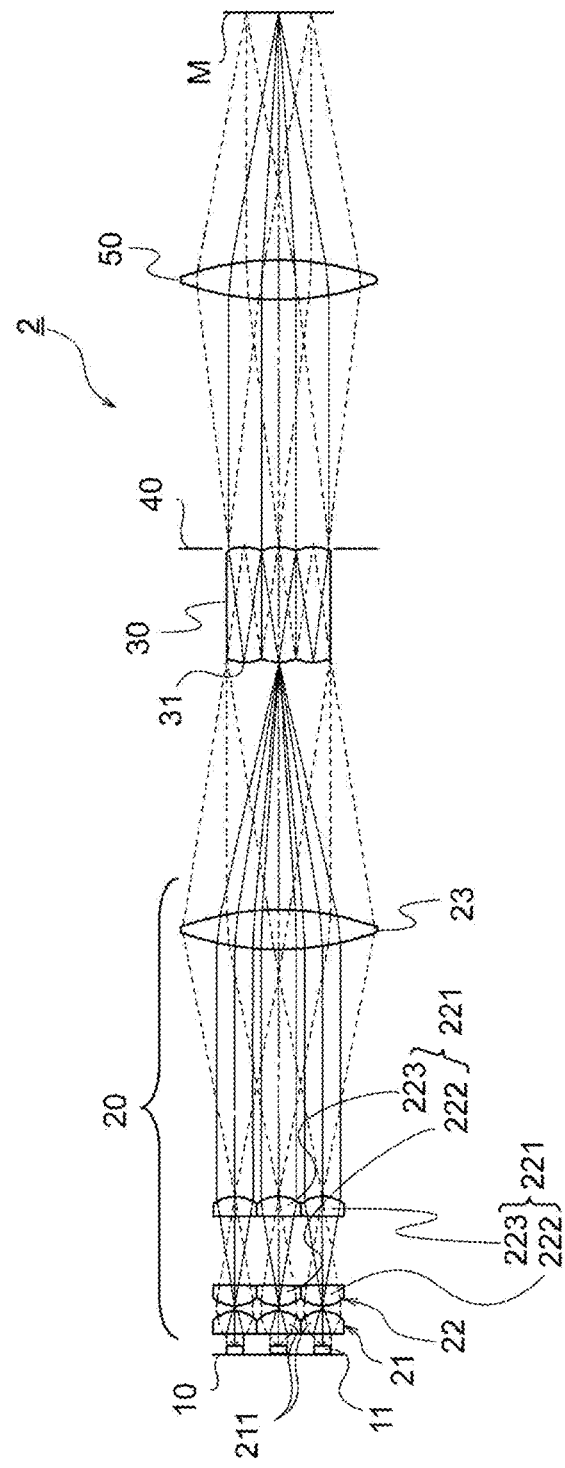
FIG. 12 is a schematic diagram illustrating another modification with a different lens array structure.

FIG. 12 is a schematic diagram illustrating another modification with a different lens array structure.

In the modification of the lighting optical system 2 shown in FIG. 12, each of the lens elements 221 of the lens array 22 is constituted with a first lens 222 and a second lens 223. In other words, the lens array 22 is constituted with a pair of a lens array of the first lenses 222 and a lens array of the second lenses 223. By constituting the lens array 22 with a pair of lens arrays, it makes it possible to reduce the weight of the lens array 22. The lens element 221 constituted with a pair of the first lens 222 and the second lens 223 is also an example of the second lens element according to the present invention.

Figure 13:
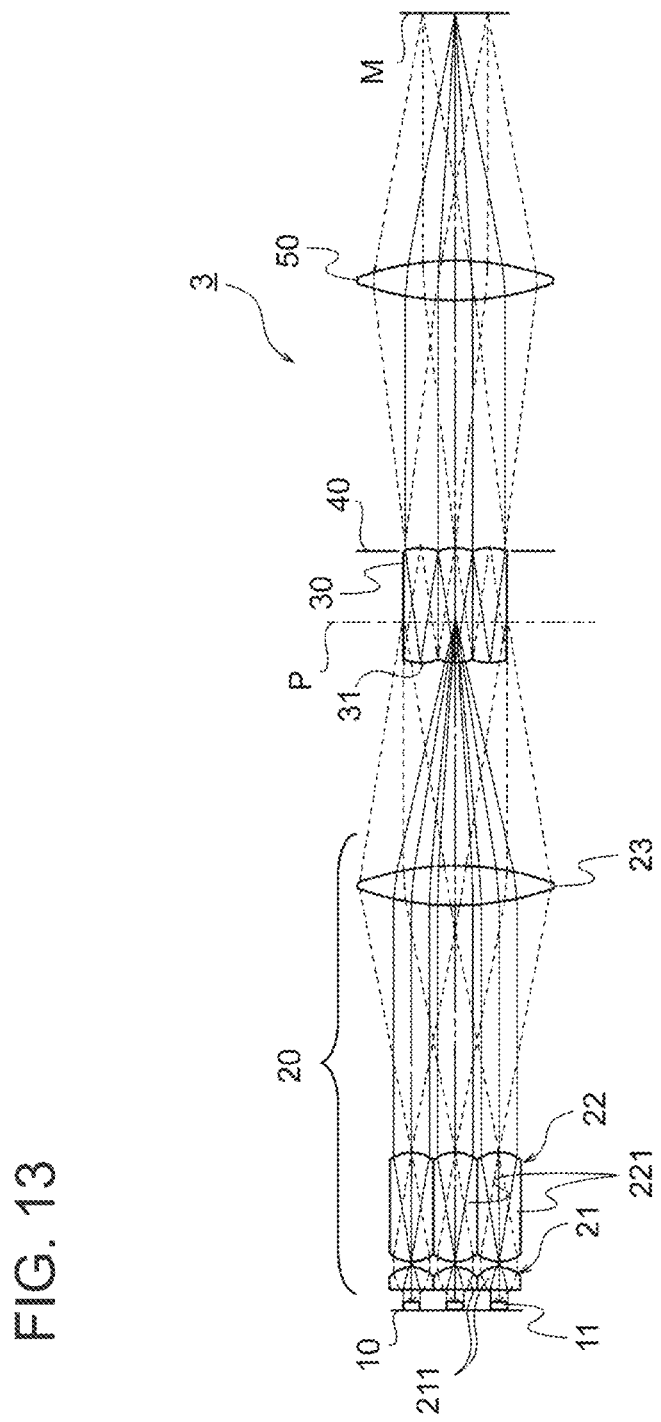
FIG. 13 is a schematic diagram illustrating yet another modification with a different distance between the relay optical system and the optical integrator.

FIG. 13 is a schematic diagram illustrating yet another modification with a different distance between the relay optical system 20 and the optical integrator 30.

In the modification of the lighting optical system 3 shown in FIG. 13, the structures of the light source 10 and relay optical system 20 and the structure from the optical integrator 30 to the condenser lens 50 are similar to the lighting optical system 1 shown in FIG. 1. However, the distance from the relay optical system 20 to the incident surface 31 of the optical integrator 30 is different between the lighting optical system 3 according to the modification and the lighting optical system 1 shown in FIG. 1. More specifically, the distance according to the modification of the lighting optical system 3 shown in FIG. 13 is shorter than the distance in the lighting optical system 1 shown in FIG. 1. As a result, light enters the incident surface 31 of the optical integrator 30 at a plane closer to the relay lens 23 side with respect to the superimposed surface P on which images are superimposed by the relay lens 23 of the relay optical system 20. By employing this arrangement, although the irradiated light enters the optical integrator 30 at a plane different from the superimposed surface P, resultantly, the utilization efficiency of light is almost the same as when the light enters at the superimposed surface P.

Figure 14:
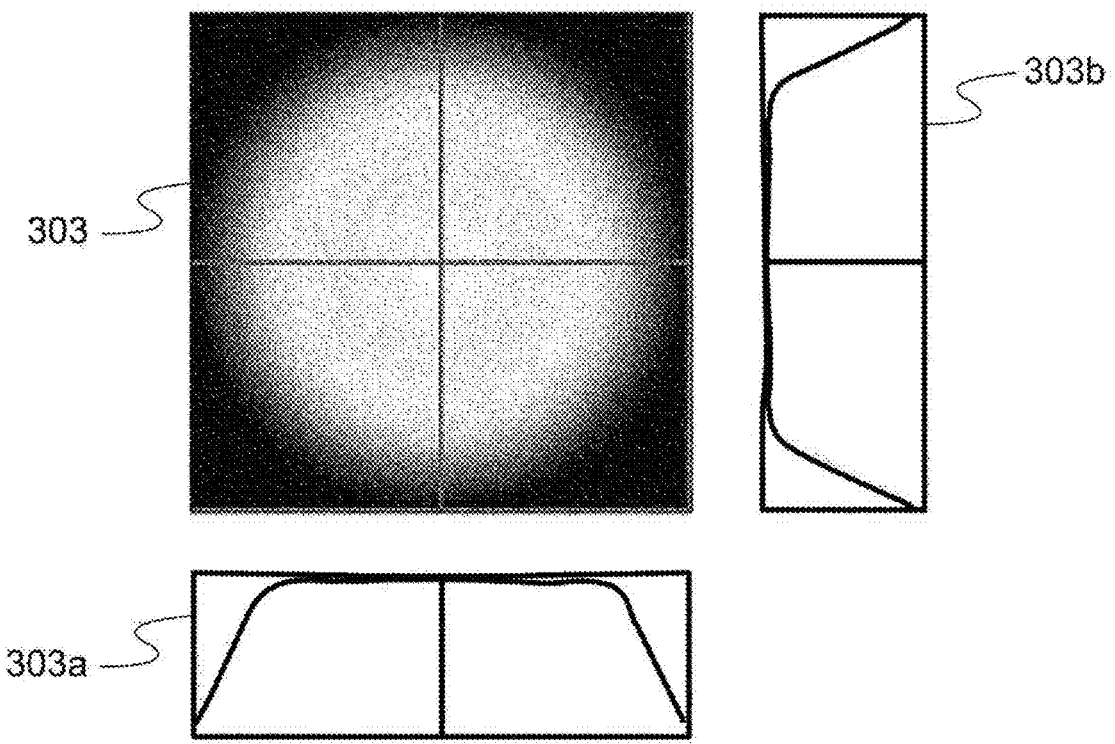
FIG. 14 is a schematic diagram illustrating an exemplary irradiance distribution at an incident surface of an optical integrator in a lighting optical system shown in FIG. 13.
Figure 15:
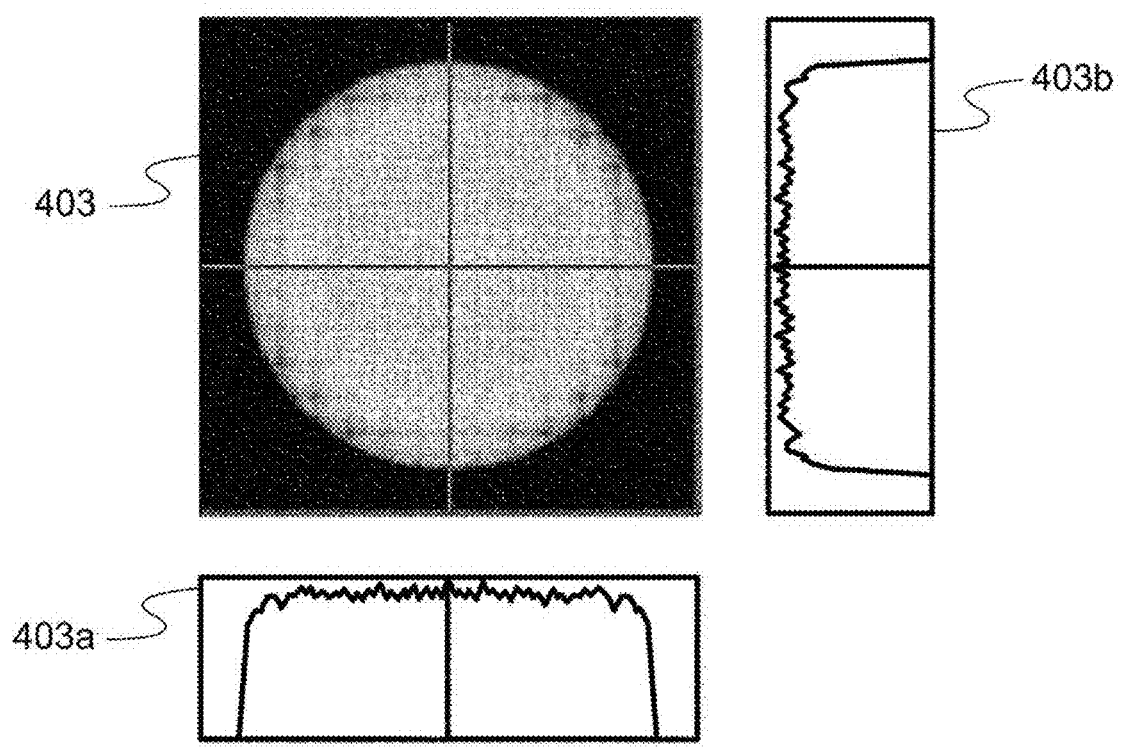
FIG. 15 is a schematic diagram illustrating an exemplary irradiance distribution at a position of an aperture diaphragm in the lighting optical system shown in FIG. 13.

FIG. 14 is a schematic diagram illustrating an exemplary irradiance distribution at an incident surface 31 of an optical integrator 30 in a lighting optical system 3 shown in FIG. 13. FIG. 15 is a schematic diagram illustrating an exemplary irradiance distribution at a position of an aperture diaphragm 40 in the lighting optical system 1 shown in FIG. 13.

As shown in the irradiance distribution chart 303 in FIG. 14, in the lighting optical system 3 according to the modification also shown in FIG. 13, the light is irradiated in a circular shape on the incident surface 31 of the optical integrator 30. Furthermore, as shown in the irradiance graphs 303a and 303b, the irradiance distribution is close to be uniform within the region irradiated with the light on the incident surface 31. The lighting optical system 3 shown in FIG. 13 confers higher uniformity than the lighting optical system 1 shown in FIG. 1. In the lighting optical system 3 shown in FIG. 13, the total quantity of light across the entire incident surface 31 of the optical integrator 30 is 729.1 in the above relative value.

As a result of light with a highly uniform irradiance distribution being irradiated onto the incident surface 31 of the optical integrator 30 in a circular shape, the light passes through the entire aperture of the aperture diaphragm 40, as shown in the irradiance distribution chart 403 in FIG. 15. Also, as shown in the irradiance graphs 403a and 403b in FIG. 15, the light passing through the aperture diaphragm 40 has an irradiance distribution that is further nearly uniform over the aperture. As a result, in the lighting optical system 3 shown in FIG. 13, the total quantity of light passing through the aperture diaphragm 40 is 563.5 in the above relative value. In this case, the utilization efficiency of light is almost the same as in the case where the incident surface 31 of the optical integrator 30 in the lighting optical system 1 shown in FIG. 1 is positioned on the superimposed surface P. However, since the lighting optical system 3 is able to have the irradiance distribution that is uniform even to the periphery on the plane of the aperture diaphragm 40 without reducing the irradiance, it is suitable for exposure of finer patterns and is superior to the comparative examples shown in FIGS. 6 and 7, and the examples shown in FIGS. 8 and 9. In addition, since the irradiance is almost the same as when the incident surface 31 of the optical integrator 30 is positioned on the superimposed surface P, it means that the incident surface 31 of the optical integrator 30 may be positioned at a further distance from the relay lens 23 relative to the superimposed surface P.

Although the above embodiments describe a certain example where the lighting optical system is applied to an exposure apparatus for the exposure in pattern, alternatively, the lighting optical system may be applied to an exposure apparatus for uniform full exposure of the exposure target, or may be applied to illumination other than exposure.

What is claimed is:

1. A lighting optical system comprising:
    a light source having a plurality of light-emitting elements configured to emit light from light-emitting surfaces, respectively, the plurality of light-emitting elements being aligned with each other in a direction in which the light-emitting surfaces spread;
    a relay optical system configured to convert a luminous intensity distribution of light emitted from each of the light-emitting elements into an irradiance distribution;
    an optical integrator having a plurality of wavefront splitting elements arranged in parallel to each other, the plurality of wavefront splitting elements being configured to wavefront split irradiated light through the relay optical system and to transmit the wavefront split light as a plurality of pencils of light rays; and
    a condenser optical system configured to superimpose the plurality of pencils of light rays on each other on a surface to be irradiated, wherein
    the relay optical system is configured to project and superimpose a plurality of the converted irradiance distributions on each other on an incident surface of the optical integrator.

2. The lighting optical system according to claim 1, wherein
    the relay optical system includes:
    a group of condenser lenses having a plurality of first lens elements corresponding to the plurality of light-emitting elements, respectively, each of the first lens elements being configured to condense light from each of the light-emitting elements;
    a lens array having a plurality of second lens elements corresponding to the plurality of first lens elements, respectively, irradiated light with the irradiance distribution corresponding to the luminous intensity distribution of light emitted from each of the light-emitting elements being irradiated through each of the first lens elements onto an incident surface of each of the second lens elements; and
    a relay lens configured to optically cooperate with exit surfaces of the second lens elements of the lens array, respectively, and to guide respective irradiated light rays irradiated onto the incident surfaces of the second lens elements to the superimposed surface and to superimpose each other on the superimposed surface.

3. The lighting optical system according to claim 2, wherein
    a distance from the relay lens to an incident surface of the optical integrator is shorter than a distance from the relay lens to the superimposed surface.

4. The lighting optical system according to claim 2, wherein
    each of the plurality of second lens elements has a square outer shape as viewed in a direction along an optical axis, and the plurality of second lens elements are bundled together.

5. The lighting optical system according to claim 2, wherein
    each of exit sides of the plurality of first lens elements of the group of condenser lenses has a square outer shape as viewed in a direction along an optical axis, and the plurality of first lens elements are bundled together.

6. The lighting optical system according to claim 5, wherein
    each of the plurality of first lens elements of the group of condenser lenses has a front element positioned on a side of the light-emitting elements and a rear element positioned on a side of the lens array, and
    the front element has a circular outer shape as viewed in the direction along the optical axis, and the rear element has a square outer shape as viewed in the direction along the optical axis.

7. An exposure apparatus comprising the lighting optical system according to claim 1, wherein the exposure apparatus is configured to irradiate a pattern mounted on the surface to be irradiated with light from the lighting optical system and to expose the pattern on an object to be exposed.

8. The exposure apparatus according to claim 7, further comprising a projection optical system configured to project an image of the pattern irradiated with the light from the lighting optical system onto the object to be exposed.

* * * * *